(12) United States Patent
Van Lieverloo

(10) Patent No.: US 6,531,744 B2
(45) Date of Patent: Mar. 11, 2003

(54) INTEGRATED CIRCUIT PROVIDED WITH OVERVOLTAGE PROTECTION AND METHOD FOR MANUFACTURE THEREOF

(75) Inventor: Henricus Antonius Lambertus Van Lieverloo, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/975,494

(22) Filed: Oct. 11, 2001

(65) Prior Publication Data

US 2002/0043688 A1 Apr. 18, 2002

(30) Foreign Application Priority Data

Oct. 16, 2000 (EP) .............................. 00203585

(51) Int. Cl.⁷ .................. H01L 29/76; H01L 29/861
(52) U.S. Cl. .................. 257/355; 257/367; 257/603; 257/604; 257/605; 257/606
(58) Field of Search .................. 257/173, 109, 257/355, 367, 361, 362, 566, 567, 525, 546, 547, 603, 604, 605, 606; 361/56, 91.1, 111, 118, 54; 437/52, 48, 59

(56) References Cited

U.S. PATENT DOCUMENTS 5,707,886 A * 1/1998 Consiglio et al. ........... 438/200

FOREIGN PATENT DOCUMENTS

JP                  200144291          * 2/2001

* cited by examiner

Primary Examiner—Nathan J. Flynn
Assistant Examiner—Tan Tran
(74) Attorney, Agent, or Firm—Aaron Walker

(57) ABSTRACT

The invention concerns an integrated circuit, including a substrate (SBSTR) with sub-circuits provided with a number of terminals, including a substrate terminal or earthing point (GND), a $V_{cc}$ power supply terminal, an input point (in) and an output point (out). At least one of the $V_{cc}$ power supply terminal, the input point or the output point is connected via an overvoltage protection circuit to the substrate terminal or earthing point, and the overvoltage protection circuit includes means with diode action formed in the substrate between the relevant terminal and the substrate terminal or earthing point. The means include two or more diode elements of the Zener type connected in series. The substrate of a first conductivity type is provided with a well (WLL) of a second, opposed conductivity type formed in the substrate. A first diode element is provided in the substrate of the first conductivity type and is formed by a first pn junction between two surface areas ($S_1, S_2$) of opposed conductivity types arranged in the substrate. At least one second diode element is provided in the well of the second conductivity type and is formed by a second pn junction between two surface areas ($S_3, S_4$) of opposed conductivity types arranged in the well, wherein the well insulates at least the second diode element from the first diode element.

4 Claims, 1 Drawing Sheet

INTEGRATED CIRCUIT PROVIDED WITH OVERVOLTAGE PROTECTION AND METHOD FOR MANUFACTURE THEREOF

FIELD OF THE INVENTION

The present invention relates to an integrated circuit of the CMOS or BICMOS type, comprising a substrate with sub-circuits provided with a number of terminals, including a substrate terminal or earthing point, a $V_{cc}$ power supply terminal, an input point and an output point, wherein at least one of the $V_{cc}$ power supply terminal, the input point or the output point is connected via an overvoltage protection circuit to the substrate terminal or earthing point, wherein the overvoltage protection circuit comprises means with diode action formed in the substrate between the relevant terminal and the substrate terminal or earthing point.

BACKGROUND OF THE INVENTION

Integrated circuits have to be protected from damage resulting from Electrostatic Discharge (ESD), which is characterized by pulses of high voltage (several kVs) of short duration (several ns) and an amperage of a few amperes. Sources of ESD are for instance the human body and electrical fields generated by machines.

The sensitivity to electrostatic discharge increases with the ever further miniaturization of integrated circuits.

An overvoltage protection circuit for protecting an integrated circuit from electrostatic discharge (ESD)is known wherein a parallel circuit is applied of on the one hand a diode in serial combination with a resistor and on the other an NMOS transistor, the gate of which is connected to the node between the diode and the resistor. A drawback of the known overvoltage protection circuit is that it takes up a relatively large amount of space on the substrate. A further drawback of the known protection circuit is that a diode of the avalanche type is employed, i.e. that diode breakdown substantially occurs as a result of the avalanche effect. Although such a diode can have a relatively high disruptive voltage, for instance in the order of magnitude of 10 V, the switching speed is relatively low, which is disadvantageous for receiving rapid pulses, and the serial resistance is relatively high, which results in a relatively large voltage drop in the case of ESD pulses. Both factors therefore have an adverse effect on the protective capacity of the protection circuit.

Instead of a diode of the avalanche type a diode of the real Zener type can be applied, i.e. a diode in which diode breakdown occurs substantially as a result of the so-called Zener effect. Such diodes have a higher switching circuit speed as well as a lower serial resistance. The drawback of Zener diodes is that operating voltage is low, about 5 V, which limits applicability to protecting circuits with a relatively small voltage difference between the relevant terminals.

SUMMARY OF THE INVENTION

It is an object of the present invention to provide an integrated circuit of the above described type which is provided with an overvoltage protection circuit in which the above stated drawbacks are obviated.

According to a first aspect of the invention an integrated circuit is provided comprising a substrate with sub-circuits provided with a number of terminals, including a substrate terminal or earthing point, a $V_{cc}$ power supply terminal, an input point and an output point, wherein at least one of the $V_{cc}$ power supply terminal, the input point or the output point is connected via an overvoltage protection circuit to the substrate terminal or earthing point, wherein the overvoltage protection circuit comprises means with diode action formed in the substrate between the relevant terminal and the substrate terminal or earthing point, wherein the means comprise two or more diode elements of the Zener type connected in series, and the substrate of a first conductivity type is provided with a well of a second, opposed conductivity type formed in the substrate, and wherein a first diode element is provided in the substrate of the first conductivity type and is formed by a first pn junction between two surface areas of opposed conductivity types arranged in the substrate and at least one second diode element is provided in the well of the second conductivity type and is formed by a second pn junction between two surface areas of opposed conductivity types arranged in the well, and wherein the well insulates at least the second diode element from the first diode element. By placing two or more Zener diodes in series a very rapid protection from electrostatic discharge (ESD) is provided which can be applied generally to integrated circuits of random operating voltage.

According to a preferred embodiment the anode part of the first diode element is electrically connected to the substrate terminal or earthing point and the cathode part is electrically connected to the anode part of the second diode element, and the cathode part of the second diode element is electrically connected to the anode part of a further diode element or to the relevant terminal.

According to a further preferred embodiment the junctions are formed by $p^+$ respectively $n^+$ surface areas, wherein an $n^+$ surface area of the p-n junction is formed in a $p^+$ surface area and the $n^+$ surface area of the p-n junction of the second diode element and the well are mutually separated by the $p^+$ surface area. In these embodiments a surface area of conductivity type corresponding with the conductivity type of the well is arranged in the well to bring the well to an appropriate voltage. In another preferred embodiment the $n^+$ surface area and the $p^+$ surface area of a diode element are positioned immediately adjacently of each other. It is also possible to form a $p^+$ surface area inside the $n^+$ surface area, this such that the $p^+$ surface area interrupts the interface with the substrate.

Although in the foregoing the substrate is manufactured from P-type material and the well from N-type material, the invention is equally applicable to a substrate of the N-type and a well of the P-type. The invention can also be applied in a so-called twin-well process.

According to another aspect of the invention a method is provided for manufacturing a protection circuit of the above described type, wherein the method comprises of:
- arranging a well of second conductivity type in a substrate of a first conductivity type by diffusion;
- arranging a highly doped surface area of the second conductivity type in the well by diffusion;
- arranging a highly doped surface area of the second conductivity type in the substrate by diffusion;
- arranging highly doped surface areas of the first conductivity type in the highly doped surface areas of the second conductivity type by diffusion.

DETAILED DESCRIPTION OF THE PRIMARY EMBODIMENT

Figure 1:
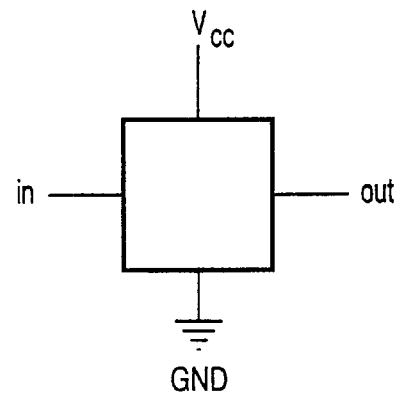
FIG. 1 shows schematically in illustrative manner an integrated circuit with four terminals.

FIG. 1 shows an integrated circuit which is provided with four terminals, a terminal for the input to the circuit, a terminal for the output of the circuit, a terminal for the supply voltage $V^{cc}$ and a terminal for the earth GND. The value of the supply voltage is random. For instance 10 V.

It will be apparent that the integrated circuit illustrated in the figure is only shown schematically. In reality the integrated circuit usually has a greater number of terminals or clamps. One or more of the terminals is provided with a protection to protect the circuit from electrostatic discharges (ESD).

ESD can be defined as the transfer of charge between two materials of different electrical voltage, one of which can be the human body. Due to the increasing miniaturization of integrated semiconductor circuits, the voltage difference at which such a transfer of charge can occur also continues to decrease. With the present dimensions of semiconductor circuits transfer can already occur at a voltage difference of 1500 V.

ESD can adversely affect the electrical characteristics of a semiconductor or disrupt the normal operation of an electronic system. Damage such as that caused by ESD can for instance be the consequence of oxide rupture, a metal or contact burn-out or of diffusion caused by excessive heating of the circuit.

Figure 2:
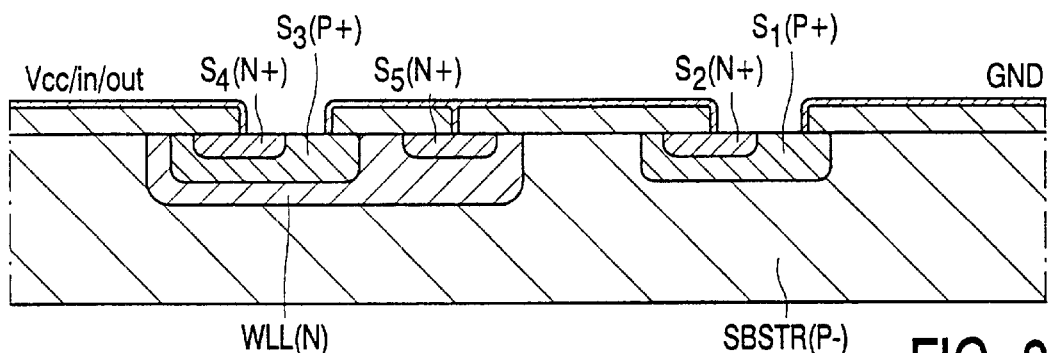
FIG. 2 shows schematically a cross-section of an integrated circuit substrate having formed therein a first preferred embodiment of a protection circuit according to the invention.

FIG. 2 shows a cross-section of a first embodiment of an ESD protection circuit embodied to protect an integrated semiconductor circuit. A first element of the Zener type is arranged in the substrate by $P^+(SP)$ diffusion in order to obtain a surface area $S_1$ and then by $N^+(SN)$ diffusion in order to obtain a surface area $S_2$ wholly within surface area $S_1$. A floating well WLL of N material is also arranged on a substrate SBSTR of $P^-$ material. In the well WLL floating on substrate SBSTR a second element of the Zener type is arranged by $P^+$ diffusion in order to obtain a surface area $S_3$ and then by $N^+$ diffusion in order to obtain a surface area $S_4$ wholly within surface area $S_3$.

Surface area $S_1$ is then connected electrically to earth, surface area $S_2$ is connected to surface area $S_3$ and surface area $S_4$ is connected electrically to the relevant terminal ($V_{cc}$/in/out) of the integrated circuit for protecting.

In order to bring the floating well WLL to a correct voltage, an additional surface area $S_5$ is arranged in the well WLL by $N^+$ diffusion, which area is connected electrically to surface area $S_2$. The surface area $S_5$ can be connected to the surface area $S_3$, as is shown in FIG. 2, but can also be connected to the surface area $S_4$ ($V_{cc}$/in/out).

The diode elements formed in the substrate and the well are of the real Zener type, also referred to as field type. That is, the doping density of both the $p^+$ and the $n^+$ surface areas is so high, the generated field is so strong (in the order of magnitude of 100 Volt/micrometer at an applied voltage of 5 V) and the depletion layer so narrow (smaller than 10 nm) that a quantum mechanical "tunnel" effect occurs. This effect enables an extremely short switching time and low resistance of the diode elements.

Depending on the materials used and the degree of doping, the Zener breakdown occurs at a voltage lying in the range of 5 to 8 V. Suppose that the Zener breakdown voltage of the diode elements amounts to for instance 6 V, breakdown then occurs in the shown embodiment at voltage peaks of more than 12 V in the supply voltage.

Figure 3:
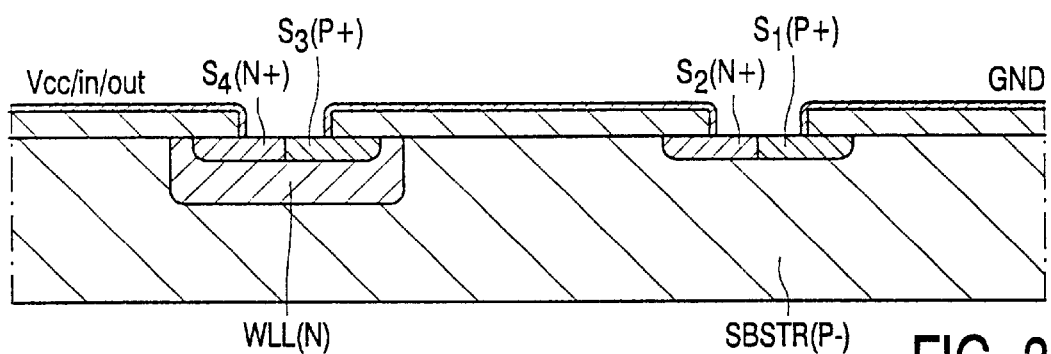
FIG. 3 shows schematically a cross-section of an integrated circuit substrate having formed therein a second preferred embodiment of a protection circuit according to the invention.

In a second preferred embodiment as shown in FIG. 3, the first diode element is arranged by diffusion in substrate SBSTR such that the (highly doped) $n^+$ and $p^+$ surface areas lie adjacently of each other. The second diode element is arranged by diffusion in the N-well WLL such that the (highly doped) $n^+$ and $p^+$ surface areas lie adjacently of each other. Because in this embodiment the $n^+$ area also adjoins the N-well WLL, no additional surface area is necessary as in the first preferred embodiment to hold the well at the correct voltage.

Figure 4:
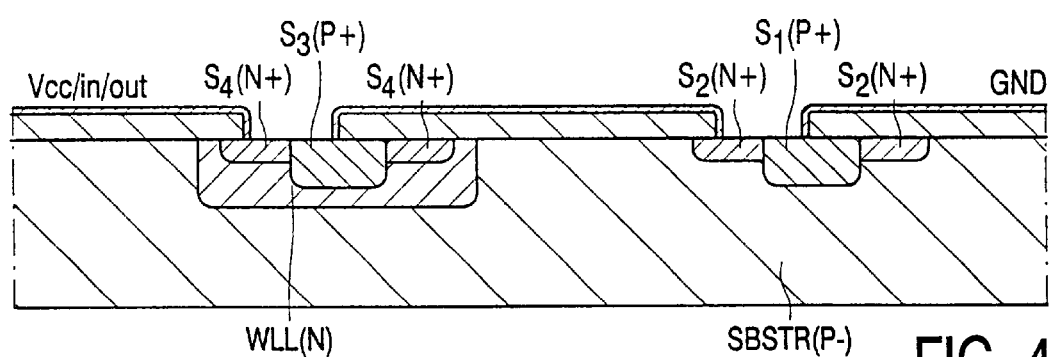
FIG. 4 shows schematically a cross-section of an integrated circuit substrate having formed therein a third preferred embodiment of a protection circuit according to the invention.

In a third preferred embodiment as shown in FIG. 4, the first diode element is formed as follows: a surface area $S_2$ is first of all arranged in substrate SBSTR by $N^+$ diffusion. A surface area $S_1$ is then arranged by $P^+$ diffusion over an area which is smaller than the area of $S_2$, wherein the $P^+$ diffusion is formed over a greater substrate depth than the $n^+$ diffusion. In the same manner the second diode element is also difflused in the N-well. The additional surface area can also be omitted in this embodiment since the N-well is brought to the correct voltage via surface area $S_4$.

The invention can of course also be applied to semiconductor circuits manufactured from an N-type starting material.

What is claimed is:

1. Integrated circuit, comprising a substrate (SBSTR) with sub-circuits provided with a number of terminals, including a substrate terminal or earthing point (GND), a $V_{cc}$ power supply terminal, an input point (in) and an output point (out), wherein at least one of the $V_{cc}$ power supply terminal, the input point or the output point is connected via an overvoltage protection circuit to the substrate terminal or earthing point, wherein the overvoltage protection circuit comprises means with diode action formed in the substrate between the relevant terminal and the substrate terminal or earthing point, wherein the means comprise two or more diode elements of the Zener type connected in series, and the substrate of a first conductivity type is provided with a well (WLL) of a second, opposed conductivity type formed in the substrate and wherein a first diode element is provided in the substrate of the first conductivity type and is formed by a first pn junction between two surface areas ($S_1,S_2$) of opposed conductivity types arranged in the substrate, and at least one second diode element is provided in the well of the second conductivity type and is formed by a second pn junction between two surface areas ($S_3,S_4$) of opposed conductivity types arranged in the well and wherein the well insulates at least the second diode element from the first diode element, wherein an $n^+$ surface area ($S_2,S_4$) of the pn junction is formed in a $p^+$ surface area ($S_1,S_3$).

2. Integrated circuit as claimed in claim 1, wherein the $n^+$ surface area ($S_4$,FIG. 2) of the p-n junction of the second diode element and the well are mutually separated by the $p^+$ surface area ($S_3$).

3. Integrated circuit as claimed in claim 2, comprising a surface area ($S_5$) arranged in the well of conductivity type corresponding with the conductivity type of the well in order to bring the well to appropriate voltage.

4. Integrated circuit, comprising a substrate (SBSTR) with sub-circuits provided with a number of terminals, including a substrate terminal or earthing point (GND), a $V_{cc}$ power supply terminal, an input point (in) and an output point (out), wherein at least one of the $V_{cc}$ power supply terminal, the input point or the output point is connected via an overvoltage protection circuit to the substrate terminal or earthing point, wherein the overvoltage protection circuit comprises means with diode action formed in the substrate between the relevant terminal and the substrate terminal or earthing point, wherein the means comprise two or more diode elements of the Zener type connected in series, and the substrate of a first conductivity type is provided with a well (WLL) of a second, opposed conductivity type formed in the substrate and wherein a first diode element is provided in the substrate of the first conductivity type and is formed by a first pn junction between two surface areas $(S_1,S_2)$ of opposed conductivity types arranged in the substrate, and at least one second diode element is provided in the well of the second conductivity type and is formed by a second pn junction between two surface areas $(S_3,S_4)$ of opposed conductivity types arranged in the well and wherein the well insulates at least the second diode element from the first diode element, wherein the $p^+$ surface area $(S_1,S_3;$ FIG. 4) is formed inside the $n^+$ surface area $(S_2,S_4)$ and interrupts the interface with the substrate.

* * * * *